United States Patent
Wei et al.

(10) Patent No.: US 10,170,343 B1
(45) Date of Patent: Jan. 1, 2019

(54) POST-CMP CLEANING APPARATUS AND METHOD WITH BRUSH SELF-CLEANING FUNCTION

(71) Applicant: Taiwan Semiconductor Manufacturing Co., Ltd., Hsinchu (TW)

(72) Inventors: Yu-Chen Wei, New Taipei (TW); Chun-Jui Chu, Taoyuan (TW); Chun-Chieh Chan, Hsinchu (TW); Jen-Chieh Lai, Tainan (TW); Shih-Ho Lin, Jhubei (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 1 day.

(21) Appl. No.: 15/638,463

(22) Filed: Jun. 30, 2017

(51) Int. Cl.
| | |
|---|---|
| *H01L 21/67* | (2006.01) |
| *B08B 1/04* | (2006.01) |
| *B24B 37/08* | (2012.01) |
| *B24B 37/04* | (2012.01) |
| *H01L 21/321* | (2006.01) |
| *H01L 21/306* | (2006.01) |

(52) U.S. Cl.
CPC ........ *H01L 21/67046* (2013.01); *B08B 1/04* (2013.01); *B24B 37/044* (2013.01); *B24B 37/08* (2013.01); *H01L 21/30625* (2013.01); *H01L 21/3212* (2013.01); *H01L 21/67051* (2013.01)

(58) Field of Classification Search
CPC . C11D 11/0047; C11D 3/30; H01L 21/02074; H01L 21/02087; H01L 21/0209; H01L 21/67046; H01L 21/30625; H01L 21/32115; H01L 21/3212; H01L 2224/03616; B08B 1/003; B81C 2201/0104
USPC .......... 156/345.12, 345.13, 345.15; 438/692, 438/693; 216/90, 91
See application file for complete search history.

(56) References Cited

U.S. PATENT DOCUMENTS

| | | | |
|---|---|---|---|
| 7,743,449 B2* | 6/2010 | Mikhaylichenko | H01L 21/67046 15/77 |
| 8,458,843 B2* | 6/2013 | Ko | B08B 1/007 15/102 |
| 2004/0142564 A1* | 7/2004 | Mullee | B08B 3/12 438/689 |
| 2012/0276817 A1* | 11/2012 | Iravani | B24B 37/00 451/8 |
| 2016/0083676 A1* | 3/2016 | Mikhaylichenko | C11D 1/146 134/1 |
| 2016/0293402 A1* | 10/2016 | Tien | B08B 1/00 |

* cited by examiner

*Primary Examiner* — Lan Vinh
(74) *Attorney, Agent, or Firm* — McClure, Qualey & Rodack, LLP

(57) ABSTRACT

Apparatuses and methods for performing a post-CMP cleaning are provided. The apparatus includes a chamber configured to receive a wafer in need of having CMP residue removed. The apparatus also includes a spray unit configured to apply a first cleaning solution to at least one surface of the wafer. The apparatus further includes a brush cleaner configured to scrub the at least one surface of the wafer. In addition, the apparatus includes at least one inner tank disposed in the chamber for storing a second cleaning solution that is used to clean the brush cleaner.

20 Claims, 13 Drawing Sheets

POST-CMP CLEANING APPARATUS AND
METHOD WITH BRUSH SELF-CLEANING
FUNCTION

BACKGROUND

Chemical Mechanical Polishing (CMP) processes are widely used in the fabrication of integrated circuits. When an integrated circuit is built up layer by layer on the surface of a semiconductor wafer, CMP processes are used to planarize the topmost layer to provide a planar surface for subsequent steps in the fabrication process. CMP processes are carried out by polishing the wafer surface against a polishing pad. A slurry containing both abrasive particles and reactive chemicals is applied to the polishing pad. The relative movement of the polishing pad and the wafer surface coupled with the reactive chemicals in the slurry allows the CMP process to planarize or polish the wafer surface by means of both physical and chemical forces.

After a CMP process, the polished wafer surface is cleaned to remove CMP residue, such as organic matter and abrasive slurry particles, in order that the surface be made ready for subsequent photolithography processes and other steps in the fabrication process. In conventional post-CMP cleaning processes, brushes are used to remove the residue on the polished wafers. The brushes are typically formed of sponges.

Although existing apparatuses and methods for a post-CMP cleaning process have been generally adequate for their intended purposes, they have not been entirely satisfactory in all respects. Consequently, it is desirable that a solution for performing a post-CMP cleaning process be provided.

BRIEF DESCRIPTION OF THE DRAWINGS

For a more complete understanding of the present disclosure, and the advantages of the present disclosure, reference is now made to the following descriptions taken in conjunction with the accompanying drawings, in which.

DETAILED DESCRIPTION

Figure 1:
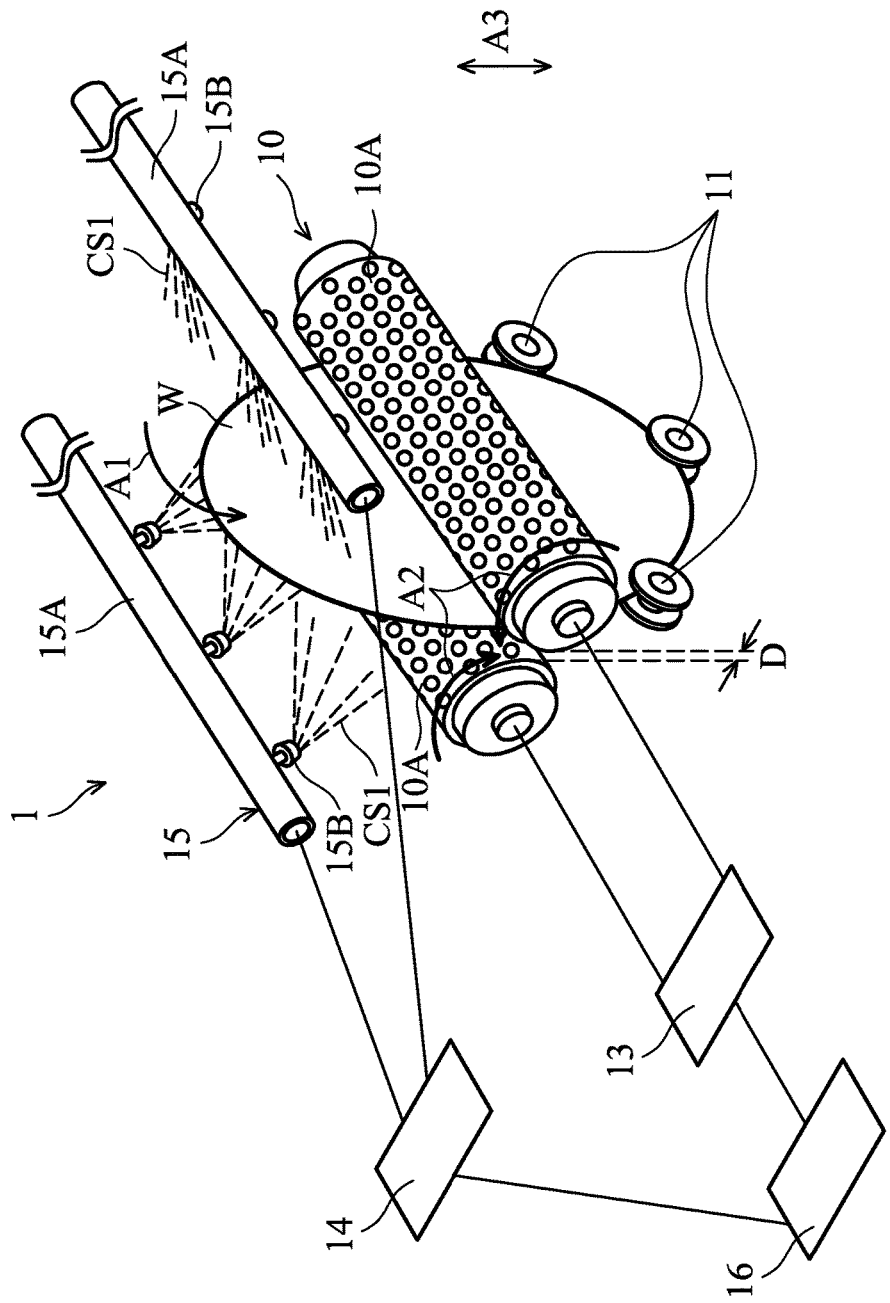
FIG. 1 is a schematic view of partial elements of a post-CMP cleaning apparatus in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. Various features may be arbitrarily drawn in different scales for the sake of simplicity and clarity.

Furthermore, spatially relative terms, such as "underlying," "below," "lower," "overlying," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Apparatuses and methods for performing a post Chemical Mechanical Polishing (CMP) cleaning are provided in accordance with various exemplary embodiments. The variations of some embodiments are discussed. Throughout the various views and illustrative embodiments, like reference numbers are used to designate like elements.

FIG. 1 schematically illustrates a perspective view of a part of a post-CMP cleaning apparatus 1 in accordance with some embodiments of the present disclosure. The post-CMP cleaning apparatus 1 may be used to clean a wafer W after a CMP process. More specifically, the post-CMP cleaning apparatus 1 may be used to perform a post-CMP cleaning to remove CMP residue, such as organic matter and abrasive slurry particles, from both surfaces (including the polished wafer surface and backside surface) of the wafer W, in order that the surfaces be made ready for subsequent steps in the fabrication process. The wafer W may be a production wafer or a test wafer made of silicon or other semiconductor materials.

As shown in FIG. 1, the post-CMP cleaning apparatus 1 includes a brush cleaner 10 including a pair of brushes 10A for performing a scrubbing process onto both surfaces of the polished wafer W. During the scrubbing process, the wafer W is supported by several rollers 11 (support mechanism) in a vertical orientation in a cleaning chamber 12 (see FIG. 4A) which encloses the brush cleaner 10, and is rotatable by the rollers 11 as the arrow A1 indicated in FIG. 1.

The brushes 10A may, for example, be porous and/or sponge like, and/or may be made of a resilient material such as polyvinyl acetate (PVA). During the scrubbing process, each brush 10A is rotatably (as the arrow A2 indicated in FIG. 1) mounted on the respective spindle (not shown), and the two brushes 10A may be driven by a drive mechanism 13 (for example a motor) or mechanisms to move vertically (as the double-headed arrow A3 indicated in FIG. 1) along the diameter direction of the wafer W and rotate/scrub over both surfaces of the wafer W. Also, the horizontal space D between the two brushes 10A, related to the scrubbing force applied to the wafer W, is adjustable by moving the brushes 10A via the drive mechanism 13.

The post-CMP cleaning apparatus 1 also includes a fluid delivery unit 14 for delivering a cleaning solution CS1 (first cleaning solution) to the wafer W via a spray unit 15. The cleaning solution CS1 may aid the scrubbing process performed by the brush cleaner 10 by washing the CMP residue from the brushes 10A and/or the surfaces of the wafer W.

The cleaning solution CS1 may include various types, wherein different types of the cleaning solution CS1 may be used to clean different CMP residue on the wafer W. In accordance with some embodiments, the cleaning solution CS1 includes water with no chemicals intentionally added. The cleaning solution CS1 may also be deionized water. In alternative embodiments, the cleaning solution CS1 includes an acid aqueous solution, which may include an organic acid such as citric acid, an inorganic acid such as $HNO_3$, or the like. In yet alternative embodiments, the cleaning solution CS1 includes an alkaline aqueous solution, which may include an organic base such as $NR_3$ (with R being alkyl), an inorganic base such as $NH_4OH$, or the like. Surfactants such as sodium dodecyl sulfate may also be added into the cleaning solution CS1 to reduce the surface tension thereof. The cleaning solution CS1 may include water as a solvent. Alternatively, the cleaning solution CS1 may use organic solvents such as methanol. The cleaning solution CS1 may also be an aqueous solution including peroxide. For example, the cleaning solution CS1 may include $H_2O_2$ in water.

As shown in FIG. 1, the spray unit 15 includes a pair of spray bars 15A fluidly connected to the fluid delivery unit 14. The two spray bars 15A are respectively adjacent to both sides of the wafer W. Several nozzles 15B are mounted on each spray bar 15A for spraying the cleaning solution CS1 onto the wafer W. Although not shown, during the scrubbing process, the two spray bars 15A may be driven by a drive mechanism (for example a motor) or mechanisms to rotate (to predetermined orientations) so that the cleaning solution CS1 is accurately directed to both surfaces of the wafer W via the nozzles 15B. The spray bars 15A may comprise a metal material (such as stainless steel). The nozzles 15B may comprise ceramics, quartz, or any other anti-corrosive materials (such as plastic).

Figure 2:
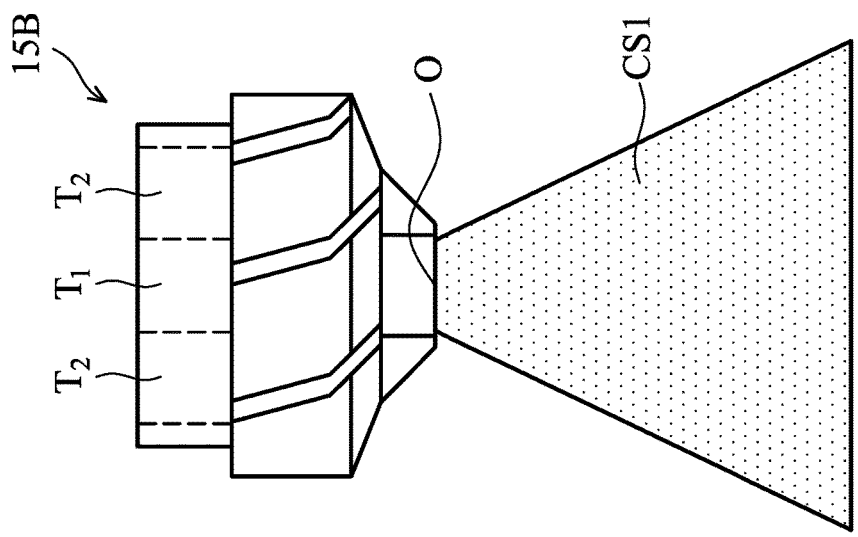
FIG. 2 is a cross-sectional view of a nozzle in accordance with some embodiments.

Various spray shapes of the cleaning solution CS1, including a jet shape, a fan shape, a mist shape, or the like, may be generated by the nozzles 15B. In accordance with some embodiments, the nozzle 15B has a rounded nozzle hole O, a first inner path T1, and a second inner path T2 surrounding the first inner path T1 as shown in FIG. 2. The first inner path T1 is fluidly connected to a gas source (not shown) which is used to supply $N_2$ or other inert gas, and the second inner path T2 is fluidly connected to the spray bar 15A. With this configuration, the cleaning solution CS1 discharged from the nozzle hole O may have various spray shapes due to the mixing of the inert gas in the first inner path T1 with the cleaning solution CS1 in the second inner path T2. For example, the nozzle 15B may spray the cleaning solution CS1 with a fan shape (as shown in FIG. 2) if the gas source has a medium pressure such as 50 to 250 psi. Alternatively, the nozzle 15B may spray the cleaning solution CS1 with a jet shape if the gas source has a higher pressure such as 250 to 1000 psi, or spray the cleaning solution CS1 with a mist shape if the gas source has a lower pressure such as 10 to 50 psi. It should be appreciated that the nozzles 15B may also include several configurations and are not limited to the embodiments described above.

Figure 3:
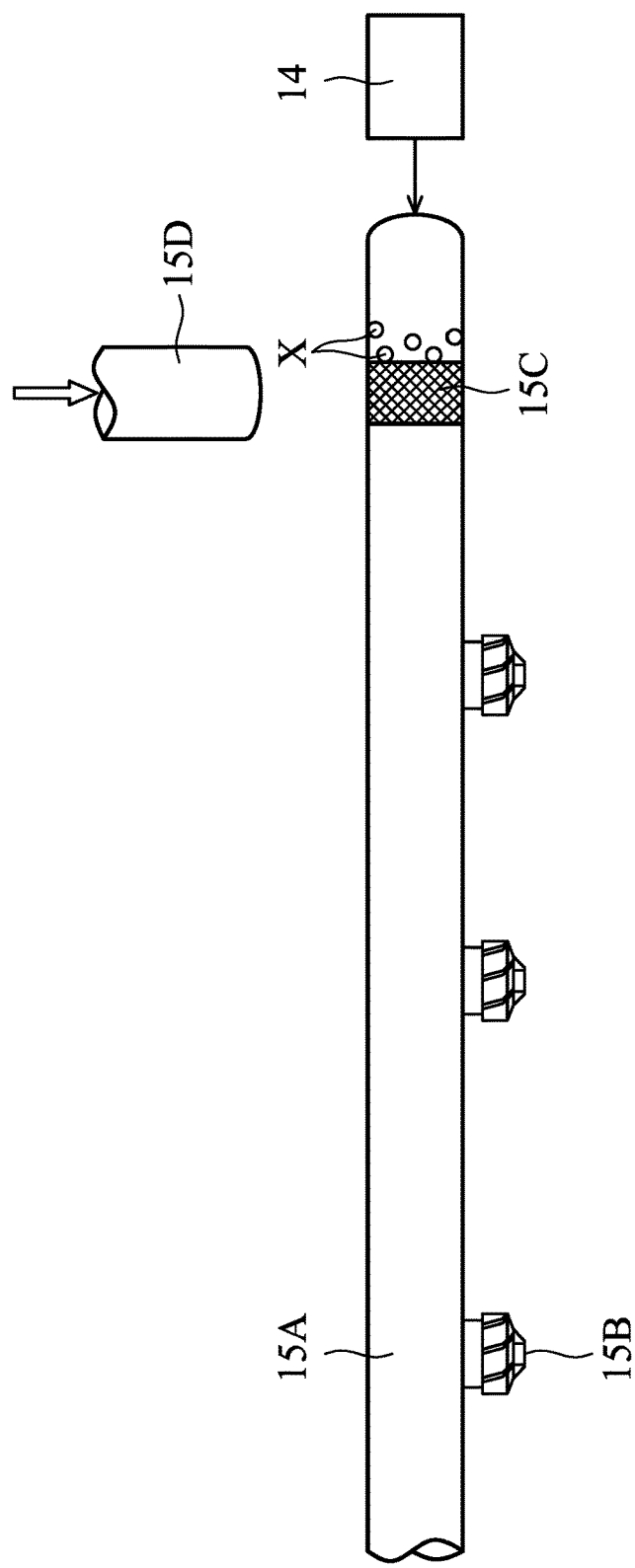
FIG. 3 is a schematic view of a spray bar equipped with a filter in accordance with some embodiments.

In accordance with some embodiments, the spray bar 15A may have a filter 15C therein in order to prevent impurities such as dust and organic material within the cleaning solution CS1 from adhering onto the wafer W or blocking the nozzles 15B. For example, the filter 15C may be mounted on the inlet end (i.e. the end connected to the fluid delivery unit 14) of the spray bar 15A to filter impurities X of the cleaning solution CS1 as shown in FIG. 3. The filter 15C may be a mesh filter with pore size in a range from, for example, 1 nm to 1 μm, and may be made of stainless steel, plastic, nylon, or woven fiberglass. In accordance with some embodiments, a cleaning pipe 15D may also be inserted into the spray bar 15A through an hole (not shown) on the spray bar 15A to wash the filter 15C via a cleaning fluid (such as deionized water or other applicable chemical cleaning solutions) and take away the impurities X from the filter 15C. Therefore, replacement of the filter 15C may be reduced. The cleaning pipe 15D may comprise rubber or any other anti-corrosive materials (such as plastic).

Referring back to FIG. 1, the post-CMP cleaning apparatus 1 also includes a controller 16 coupled to the fluid delivery unit 14 and the drive mechanism 13 and configured to control their operation. For example, the controller 16 may comprise a microprocessor, and the microprocessor may be programmed to active and/or control the fluid delivery unit 14 so as to deliver the cleaning solution CS1 to the spray unit 15 at predetermined times and/or rates, and/or for a predetermined length of time. Similarly, the microprocessor of the controller 16 may be programmed to active and/or control the drive mechanism 13 so as to move and/or rotate the brushes 10A of the brush cleaner 10 at predetermined times and/or rates, and/or for a predetermined length of time. Although not shown, the controller 16 may also be coupled to the rollers 11 and exert similar control over the rotation of the wafer W.

As the post-CMP cleaning apparatus 1 removes the CMP residue from the surfaces of the wafer W during the scrubbing process, the CMP residue may tend to adhere to and build up on the porous surface of the brushes 10A, which eventually contaminates the brushes 10A and render them ineffective. In addition, the CMP residue accumulated on the brushes 10A is likely to re-adhere to the wafer W, resulting in lower cleaning quality of the post-CMP cleaning process. Because of cost pressures, the dirty brushes 10A may also not be changed frequently.

Figure 4A:
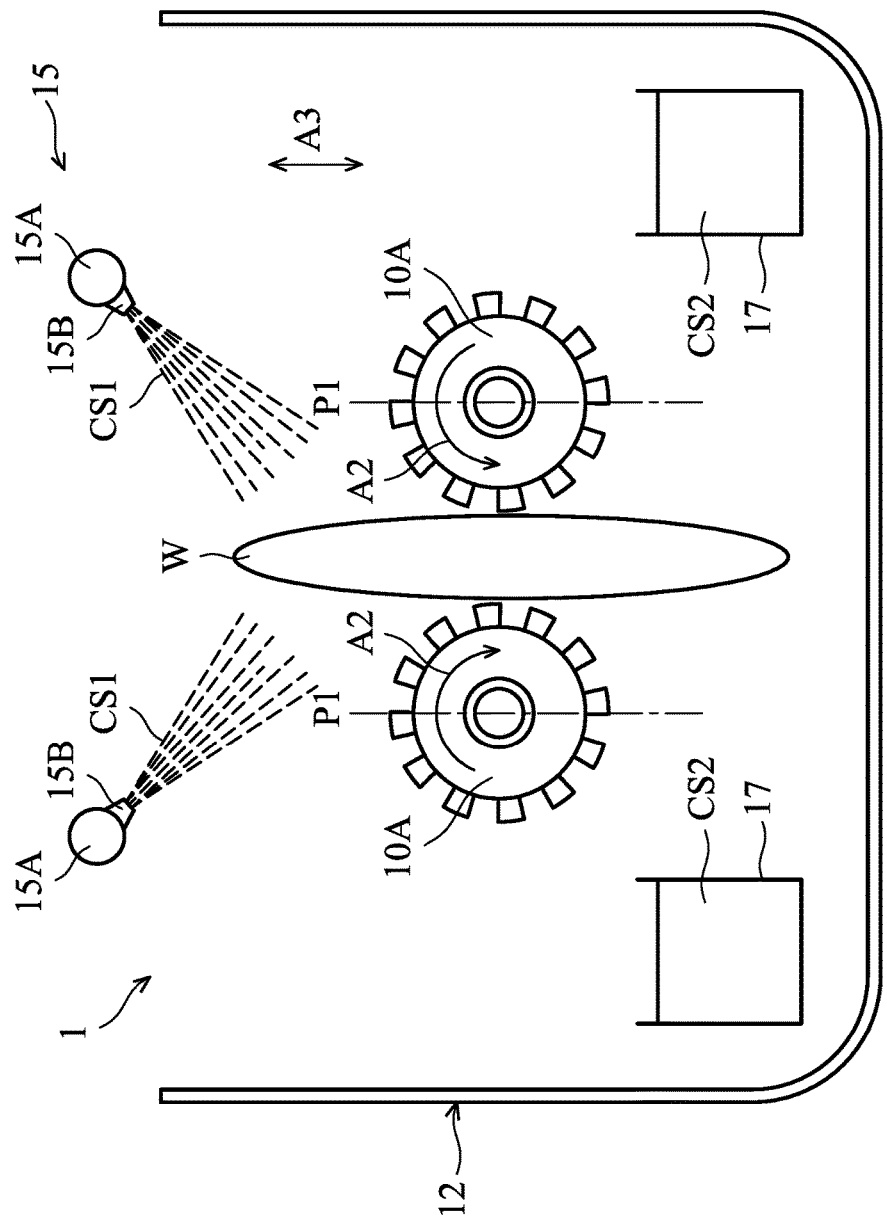
FIG. 4A is a schematic view illustrating an intermediate stage of a post-CMP cleaning process in accordance with some embodiments.
Figure 4B:
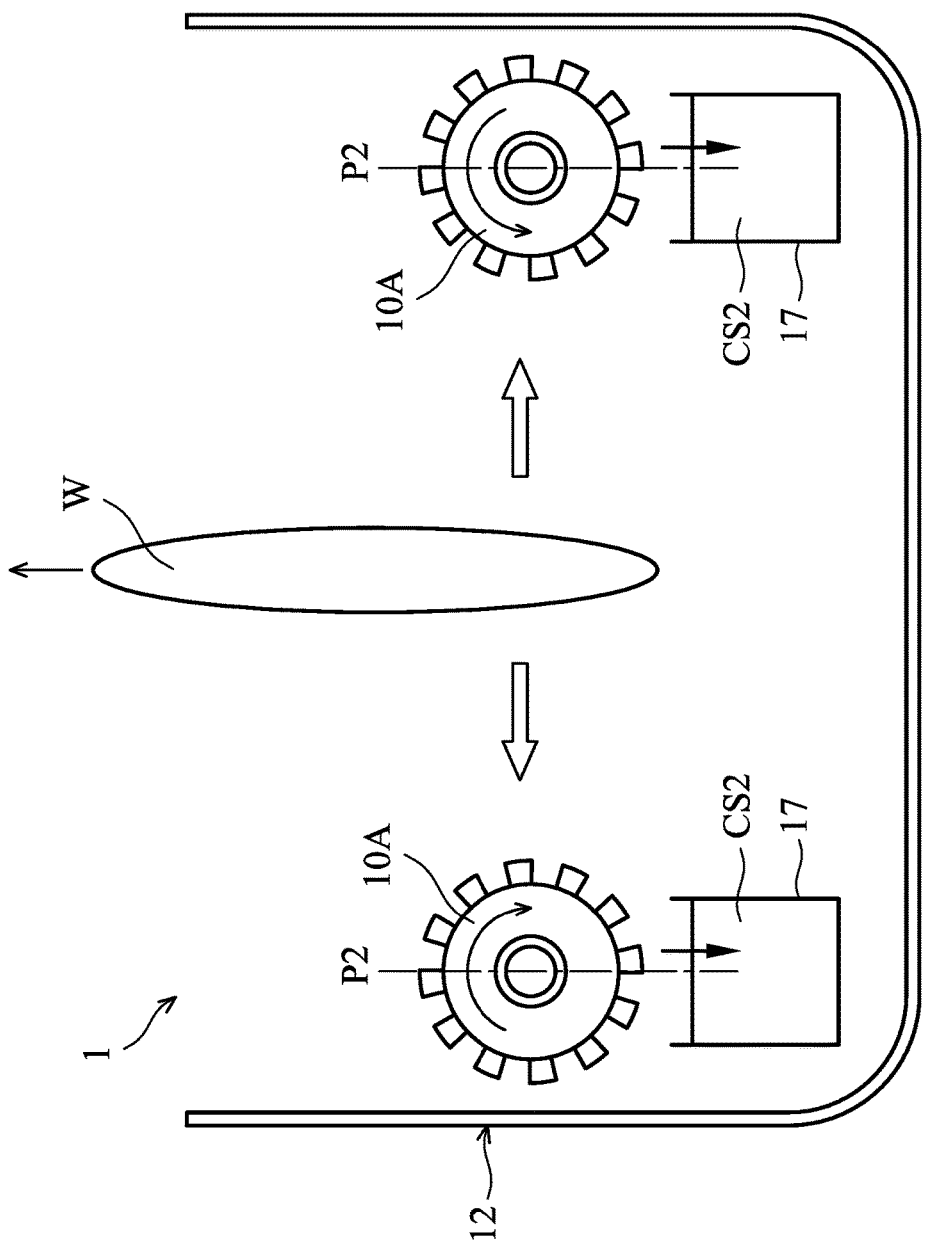
FIG. 4B is a schematic view illustrating an intermediate stage of a post-CMP cleaning process in accordance with some embodiments.
Figure 5:
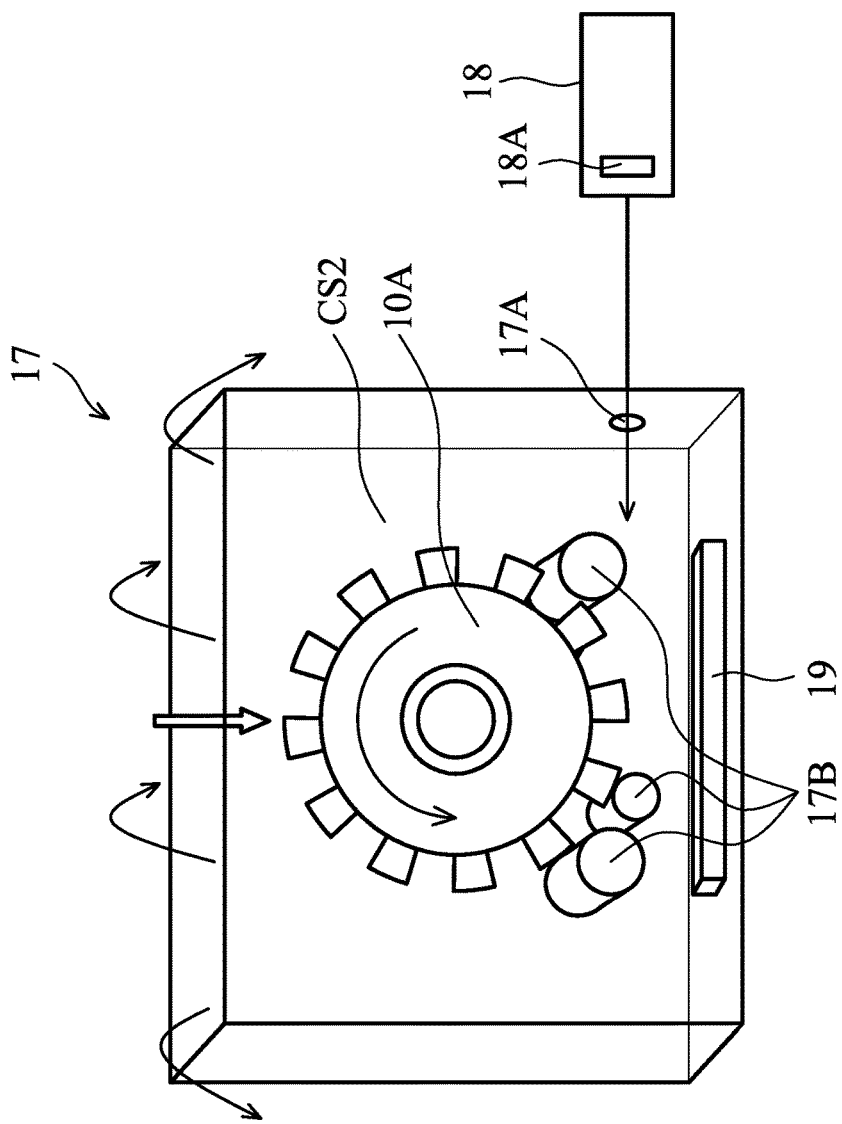
FIG. 5 is a schematic view of an inner tank in accordance with some embodiments.
Figure 6:
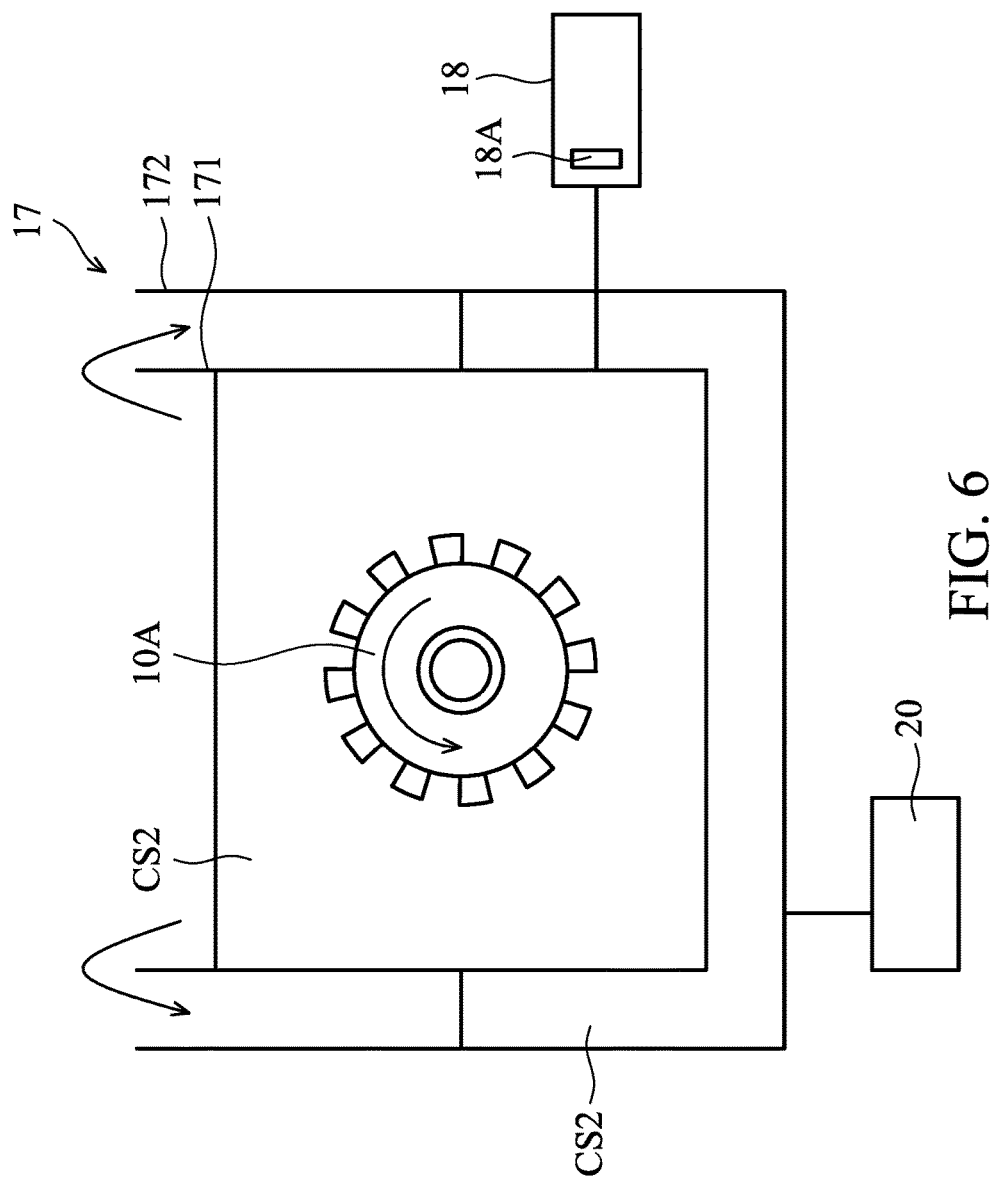
FIG. 6 is a schematic view of an inner tank having inner and outer compartments in accordance with some embodiments.

The post-CMP cleaning apparatus 1 in accordance with some embodiments further include a brush self-cleaning function/mechanism for cleaning the dirty brushes 10A (prolonging their life) and improving the cleaning quality of the post-CMP cleaning process using the post-CMP cleaning apparatus 1, which will be illustrated in FIGS. 4 to 6.

FIGS. 4A and 4B schematically illustrate two intermediate stages of a post-CMP cleaning process using a post-CMP cleaning apparatus (for example the post-CMP cleaning apparatus 1 described above) in accordance with some embodiments. The brushes 10A in the post-CMP cleaning apparatus 1 are configured to be moved between a first position P1 shown in FIG. 4A and a second position P2 shown in FIG. 4B.

At the first position P1, the brushes 10A may perform a scrubbing process upon the polished wafer W after a CMP process. More specifically, after the wafer W is vertically loaded into the chamber 12, the brushes 10A may move vertically (as the double-headed arrow A3 indicated in FIG. 4A) along the diameter direction of the wafer W to rotate/scrub (as the arrows A2 indicated in FIG. 4A) over both surfaces of the wafer W while it is rotated by several rollers (not shown). At the same time, a cleaning solution CS1 (first cleaning solution) may be sprayed onto both surfaces of the wafer W via the spray unit 15 described above. Through cooperation of the scrubbing force from the brushes 10A and the washing force of the cleaning solution CS1, the CMP residue on the surfaces of the wafer W is removed.

Afterwards, the wafer W is retrieved out of the chamber 12, and the brushes 10A are moved horizontally to the second position P2 (FIG. 4B) and submerged into a cleaning solution CS2 (second cleaning solution) stored in two inner tanks 17 in the chamber 12 so as to be cleaned by the cleaning solution CS2 (i.e. to perform a brush cleaning process).

The position of the two inner tanks 17 (i.e. the second position P2) may be close to opposite sidewalls of the chamber 12 and spaced from the first position P1 by a distance, which can prevent the cleaning solution CS1 that have been used to clean the wafer W falling from the wafer W and the brushes 10A from entering the inner tanks 17 to contaminate the cleaning solution CS2. Although not shown, the chamber 12 may also have a discharge opening formed on the bottom surface thereof. A drain unit fluidly connected to the discharge opening may be used to drain the cleaning solution CS1 (and/or the cleaning solution CS2 overflowing from the inner tanks 17) from the chamber 12.

In accordance with some embodiments, the inner tanks 17 are independently disposed in the chamber 12 and comprise ceramics, quartz, or any other anti-corrosive materials (such as plastic). Alternatively, the inner tanks 17 and the chamber 12 are integrally formed in one piece.

In accordance with some embodiments, the cleaning solution CS2 includes an alkaline aqueous solution with pH value greater than or equaling 7.5, such as $NH_4OH$, NaOH, Tetramethyl Ammnium Hydroxide (TMAH), or the like, in order for the CMP residue engaged on the porous surface of the brushes 10A to be removed effectively. In accordance with some embodiments, the first cleaning solution CS1 and the second cleaning solution CS2 are different types of cleaning solutions. Alternatively, the cleaning solution CS1 and the cleaning solution CS2 are the same type of cleaning solutions.

FIG. 5 schematically illustrates the internal configuration of an inner tank 17 in accordance with some embodiments. As shown in FIG. 5, the inner tank 17 has an inlet opening 17A formed on a wall surface thereof for fluidly connecting a liquid delivery unit 18. The liquid delivery unit 18 is configured to supply the cleaning solution CS2 into the inner tank 17. In some embodiments, when the brush 10A is submerged into and cleaned by the cleaning solution CS2, the liquid delivery unit 18 continuously supplies the cleaning solution CS2 into the inner tank 17 to make the cleaning solution CS2 in the inner tank 17 flow and overflow upwardly into the chamber 12 (FIG. 4B). Therefore, the cleaning solution CS2 stored in the inner tanks 17 can be kept fresh and clean (i.e. the cleaning solution CS2 containing the CMP residue from the brushes 10A may leave the inner tanks 17), improving the efficiency of cleaning the brushes 10A.

In accordance with some embodiments, the liquid delivery unit 18 may include a heater 18A for heating the cleaning solution CS2 supplied to the inner tank 17 as shown in FIG. 5. For example, the cleaning solution CS2 may be heated by the heater 18A to have a temperature between about 15 □ and about 25 □. The cleaning solution CS2 may also be heated by the heater 18A to a temperature in the range between about 25 □ and about 80 □. With the increased temperature, the efficiency of cleaning the brush 10A may be improved. Alternatively, a temperature higher than about 80 □ or lower than about 15 □ may also be used.

In accordance with some embodiments, the inner tank 17 may also have a vibrator 19 therein as shown in FIG. 5, which is configured to induce a vibration to the cleaning solution CS2, thereby improving the efficiency of cleaning the brush 10A. The vibrator 19, such as a high-frequency vibrator, a megasonic vibrator, or the like, may be attached to one wall surface of the inner tank 17.

In accordance with some embodiments, the inner tank 17 may also have several protruding structures 17B formed on a wall surface thereof as shown in FIG. 5. The protruding structures 17B are configured to engage the brush 10A when the brush 10A is submerged into and cleaned by the cleaning solution CS2 in the inner tank 17. For example, while submerged into the cleaning solution CS2 in the inner tank 17, the brush 10A may be driven by the drive mechanism 13 (FIG. 13) to be pressed against and rotate (as the arrow indicated in FIG. 5) over the protruding structures 17B. Therefore, the CMP residue engaged on the porous surface of the brushes 10A can be effectively removed by friction between the brush 10A and the protruding structures 17B of the inner tank 17.

The heater 18A, the vibrator 19, and the protruding structures 17B may be used independently or together, according to the actual requirements and the operation conditions. Although not shown, the inner tank 17 may also have a discharge opening formed on the bottom surface thereof. A drain unit fluidly connected to the discharge opening may be used to drain the cleaning solution CS2 from the inner tank 17.

FIG. 6 schematically illustrates an inner tank 17 having an inner compartment 171 and an outer compartment 172 in accordance with some embodiments. The inner compartment 171 is configured to store cleaning solution CS2 and receive the brush 10A. In other words, the brush 10A is submerged into the cleaning solution CS2 stored in the inner compartment 171 during the brush cleaning process. Similar to the embodiments in FIG. 5, a liquid delivery unit 18 is configured to supply the cleaning solution CS2 into the inner compartment 171. Also, a heater 18A of the liquid delivery unit 18 may be used to heat the cleaning solution CS2 supplied to the inner compartment 171.

The outer compartment 172 is configured to receive the cleaning solution CS2 overflowing from the inner compartment 171 (i.e. to provide a buffer tank outside the inner compartment 171). Moreover, a drain unit 20 may be coupled to the outer compartment 172 to drain the cleaning solution CS2 from the outer compartment 172. With this configuration, the cleaning solution CS2 in the inner tank 17 may not overflow into the chamber 12 (FIG. 4B), and hence an interaction occurring between the cleaning solution CS2 and the cleaning solution CS1 remained in the chamber 12 may be avoided. Also, the chemical solution handling at the downstream ends of the drain unit coupled to the chamber 12 and the drain unit 20 coupled to the inner tank 17 may be simplified further.

By providing inner tanks 17 (such as the inner tanks 17 in FIGS. 4 to 6) into the chamber 12 to store a cleaning solution CS2, the brushes 10A (i.e. the brush cleaner 10) may be submerged into and cleaned by the cleaning solution CS2 after the scrubbing process. Alternatively, the brushes 10A may also be submerged into and cleaned by the cleaning solution CS2 before the scrubbing process in accordance with some embodiments. It is therefore a brush self-cleaning function in the post-CMP cleaning apparatus 1 is achieved, resulting in the extended lifespan of the brush cleaner 10. Furthermore, the cleaning quality of the post-CMP cleaning process using the post-CMP cleaning apparatus 1 is also improved because the brush cleaner 10 is maintained at consistent levels of cleanliness for the wafers W from batch-to-batch and job-to-job.

Figure 7:
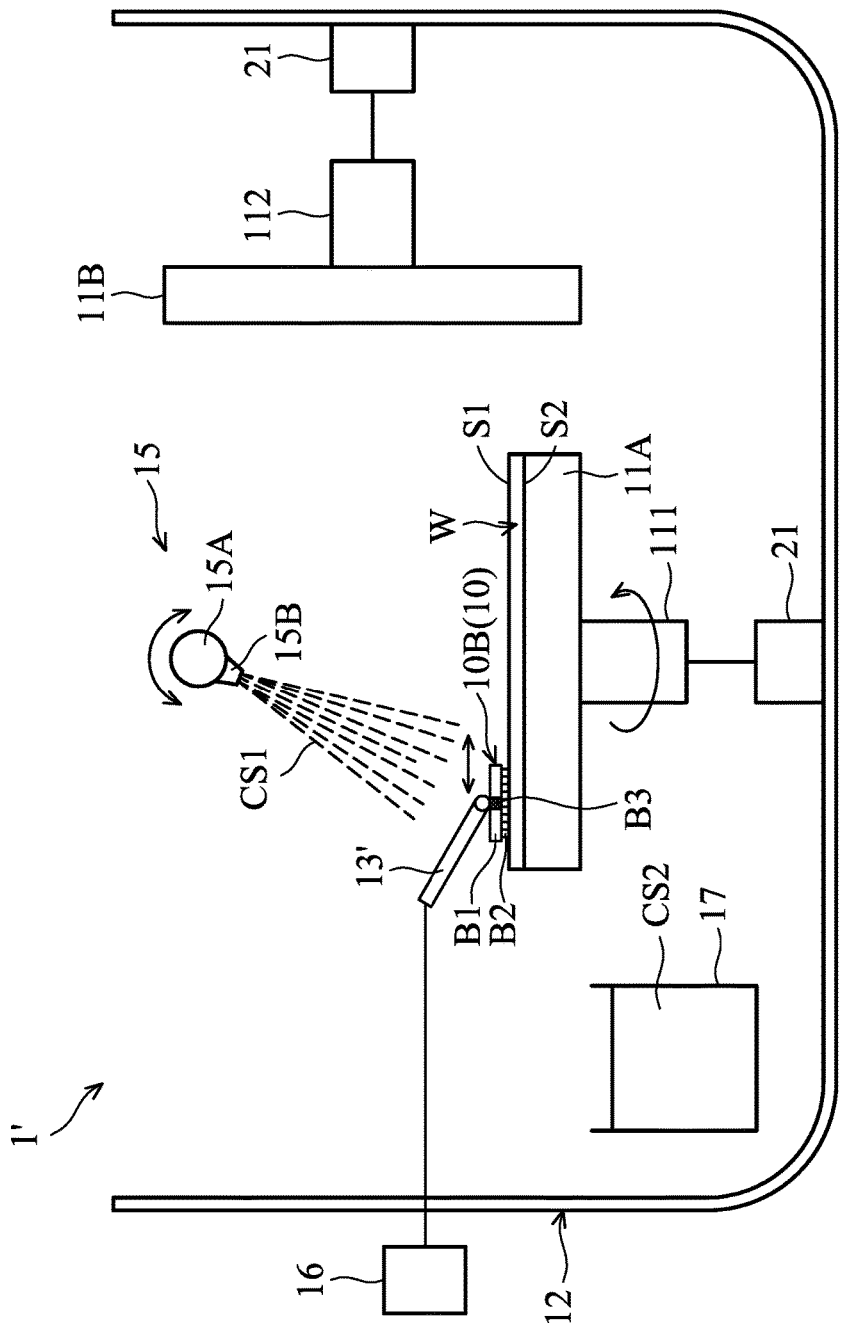
FIG. 7 is a schematic view of partial elements of a post-CMP cleaning apparatus in accordance with some embodiments.

The above inner tanks 17 may also be used in various types of post-CMP cleaning apparatuses. Referring to FIG. 7, which schematically illustrates a perspective view of a part of another post-CMP cleaning apparatus 1' in accordance with some embodiments of the present disclosure. The post-CMP cleaning apparatus 1' includes a chamber 12, a first stage 11A and a second stage 11B (support mechanism), a spray unit 15, a brush cleaner 10, and an inner tank 17. The configuration and function of the chamber 12 and the inner tank 17 are the same or similar to those in the above embodiments (FIGS. 1 to 6) and thus are not repeated here.

The first stage 11A is configured to support a polished wafer W in a horizontal orientation in the chamber 12 so that a first surface S1 (for example the polished wafer surface) of the wafer W faces the brush cleaner 10 during a scrubbing process (which will be illustrated later) as shown in FIG. 7. During the scrubbing process, the wafer W can be held on top of the first stage 11A using an electrostatic chuck (not shown) therein. Alternatively, other clamping means may also be used.

Moreover, the first stage 11A connects to a spindle 111 as shown in FIG. 7, and the first stage 11A and the wafer W thereon can be rotated (as the arrow indicated in FIG. 7) by a drive mechanism 21 coupled to the spindle 111 during the scrubbing process. In accordance with some embodiments, the first stage 11A is rotated in a speed range from 0 to 600 rpm. The drive mechanism 21 may also be used to drive first stage 11A to move along a direction perpendicular to the surface of the wafer W. The drive mechanism 21 may comprise a cylinder, a motor, a roller, a belt, or a combination thereof.

Figure 9:
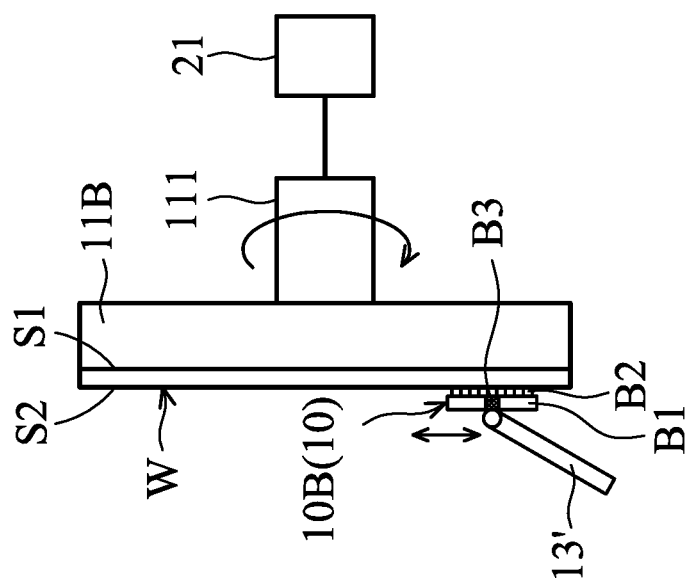
FIG. 9 is a schematic view illustrating that the wafer's backside surface is cleaned while the wafer is mounted on the second stage in accordance with some embodiments.
Figure 11:
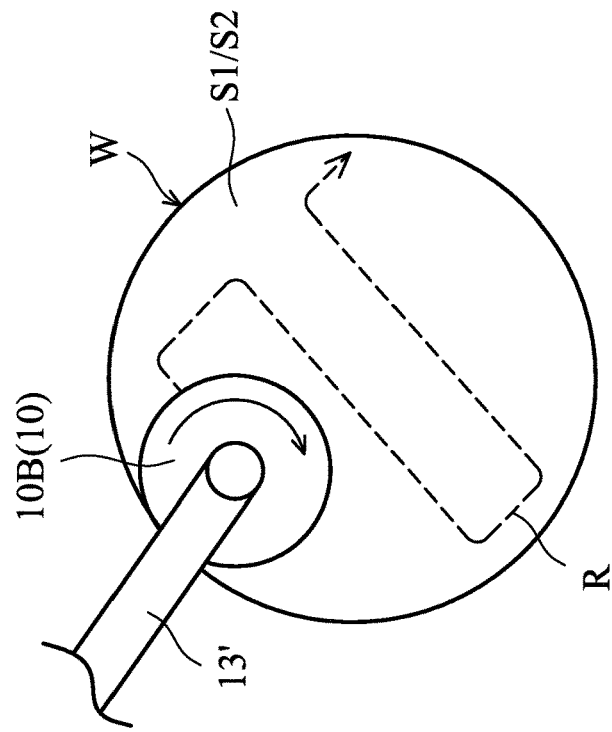
FIG. 11 is a schematic view illustrating the brush cleaner having a specific sweeping profile in accordance with some embodiments.
Figure 10:
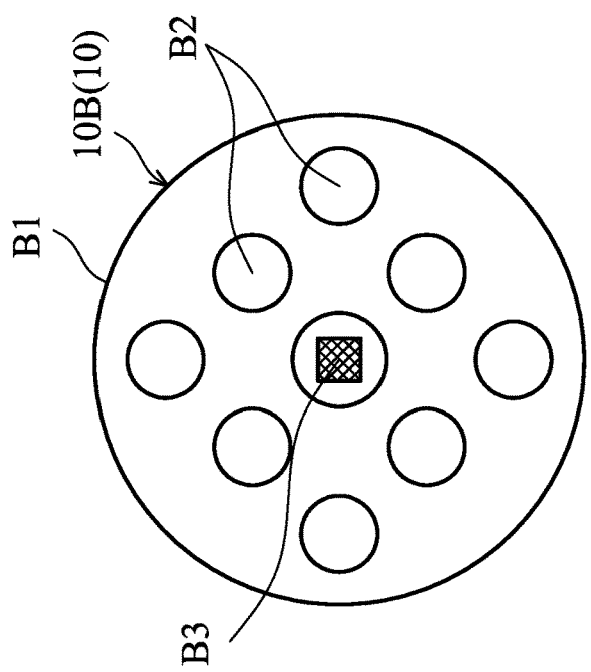
FIG. 10 is a bottom view of a brush cleaner in accordance with some embodiments.

The second stage 11B is configured to support the wafer W in a vertical orientation in the chamber 12 so that a second surface S2 (for example the backside surface opposite to the first surface S1) of the wafer W faces the brush cleaner 10 during the scrubbing process as shown in FIG. 9. The mechanisms for holding the wafer W on the second stage 11B and rotating/moving the second stage 11B are the same or similar to those for the first stage 11A and thus are not repeated here.

Figure 8:
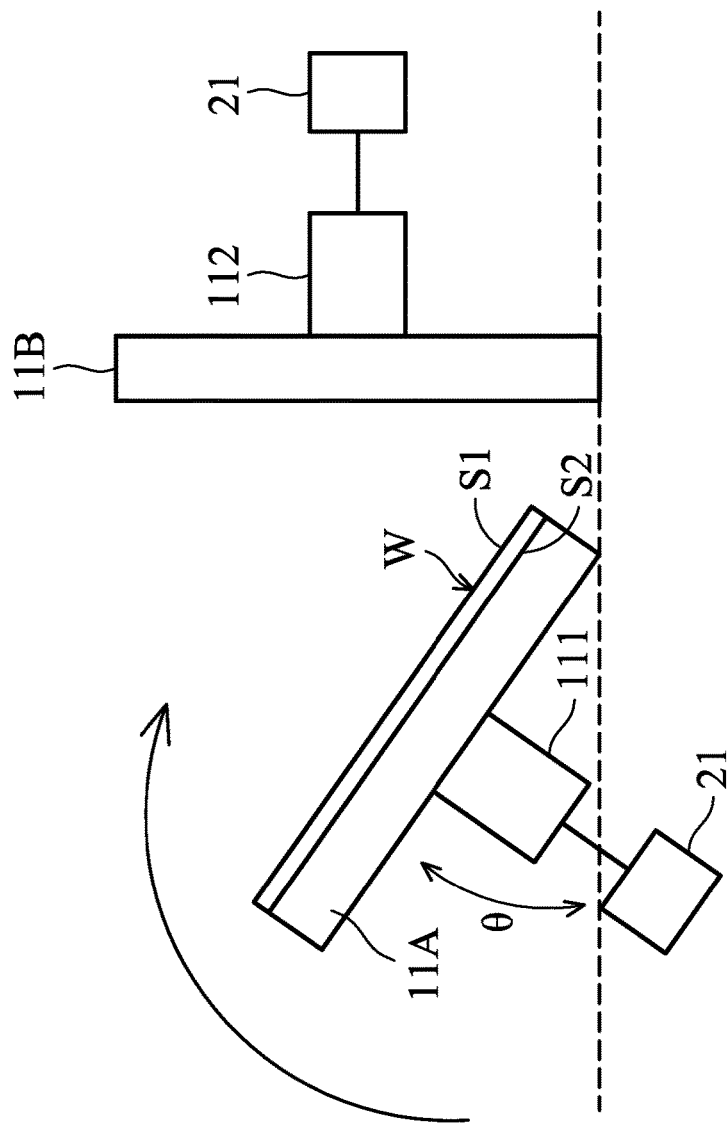
FIG. 8 is a schematic view illustrating that a first stage tilts to transfer a wafer thereon to a second stage in accordance with some embodiments.

In accordance with some embodiments, after the brush cleaner 10 scrubs/rotates over the first surface S1 of the wafer W held on the first stage 11A to remove the CMP residue from the first surface S1, the first stage 11A may also be driven by the drive mechanism 21 to tilt so as to transfer the wafer W thereon to the second stage 11B as shown in FIG. 8. The tilt angle θ of the first stage 11A with respect to the bottom surface of the chamber 12 is between about 0 degree and about 90 degrees. Afterwards, after the brush cleaner 10 scrubs/rotates over the second surface S2 of the wafer held on the second stage 11B to remove the CMP residue from the second surface S2 (FIG. 9), the second stage 11B may also be driven by the drive mechanism 21 to tilt (not shown) so as to transfer the wafer W thereon back to the first stage 11A for subsequent steps (e.g. removing the wafer W from the chamber 12).

In accordance with some embodiments, a heater (not shown) may also be mounted in the first stage 11A and/or the second stage 11B for heating the wafer W to have a temperature between about 25 □ and about 85 □, so that the CMP residue on the wafer W can be removed more easily.

As shown in FIG. 7, the spray unit 15 includes a spray bar 15A and several nozzles 15B (only one nozzle 15B is depicted due to the restricted viewing angle) mounted on the spray bar 15A. The configuration and function of the spray bar 15A and nozzles 15B are the same or similar to those in the above embodiments (FIGS. 1 to 3) and thus are not repeated here. It should only be noted that the spray unit 15 is disposed adjacent to both the first stage 11A and the second stage 11B and may be driven by a drive mechanism (for example a motor (not shown)) to rotate so as to spray the cleaning solution CS1 onto the first surface S1 or the second surface S2 of the wafer W based on the location and/or movement of the brush cleaner 10 during the scrubbing process.

As shown in FIGS. 7, 9, 10 and 11, the brush cleaner 10 includes a brush 10B which is configured as a disk shape. More specifically, the brush 10B has a disk-shaped main body B1 and several protrusions B2 formed on the bottom of the main body B1, wherein the main body B1 may be of plastic material with enough structural strength and the protrusions B2 may be made of a resilient material such as PVA. The brush 10B scrubs and removes the CMP residue on both surfaces S1 and S2 of the wafer W via the resilient protrusions B2. In accordance with some embodiments, the diameter of the main body B1 is in the range between about 2 inches and about 6 inches. Alternatively, the diameter of the main body B1 may also be greater than about 6 inches.

In accordance with some embodiments, the top of the main body B1 is coupled to a robotic arm 13' which is configured to moving the brush 10B across over both surfaces S1 and S2 of the wafer W to perform the scrubbing process. Moreover, the robotic arm 13' is electrically connected to a controller 16 (similar to the controller 16 of the above embodiments) which may be programmed to active and/or control the robotic arm 13' so as to move and/or rotate (as the arrow indicated in FIG. 11) the brush 10B at predetermined times and/or rates, and/or for a predetermined length of time, and/or in a specific sweeping profile R (FIG. 11) above both surfaces S1 and S2 of the wafer W. The specific sweeping profile R includes various types which may be changed based on the actual requirements for improving the cleaning efficiency of the brush cleaner 10.

In accordance with some embodiments, a sensor B3 may also be mounted on the brush cleaner 10, for example, mounted at the center of the main body B1 (FIG. 10), for detecting the position of the CMP residue on both surfaces S1 and S2 of the wafer W. Although it is not shown, the sensor B3 is electrically connected to the controller 16, and the controller 16 may control the operation of the brush cleaner 10 based on a detection signal from the sensor B3. For example, if the sensor B3 detects a CMP residue located at a specific position on the wafer W and generates a detection signal, the controller 16 may control the brush cleaner 10 based on the detection signal to stay at the specific position for a longer time and/or rotate at a higher speed so as to successfully remove the CMP residue. Alternatively, the controller 16 may also control to robotic arm 13' so as press the brush cleaner 10 against the wafer W with a higher pressure based on the detection signal so as to remove the CMP residue on the specific position of the wafer W.

In accordance with some embodiments, one or more sensors B3 may also be mounted on the brush cleaner 10, the first stage 11A, and/or the second stage 11B for detecting the position of the CMP residue on both surfaces S1 and S2 of the wafer W. There are various types of sensors B3, including optical sensors, infrared sensors, motor torque sensors, and gas pressure sensors.

With the above configuration, the CMP residue on both surfaces S1 and S2 of the wafer W can be removed by the scrubbing force from the brush cleaner 10 in cooperation with the washing force of the cleaning solution CS1.

It should also be noted that the brush cleaner 10 may be submerged into and cleaned by a cleaning solution CS2 stored in the inner tank 17 disposed in the chamber 12 before or after the above scrubbing process. Therefore, a brush self-cleaning function in the post-CMP cleaning apparatus 1' is achieved, resulting in the extended lifespan of the brush cleaner 10. Furthermore, the cleaning quality of the post-CMP cleaning process using the post-CMP cleaning apparatus 1' is also improved because the brush cleaner 10 is maintained at consistent levels of cleanliness for the wafers W from batch-to-batch and job-to-job.

Although the post-CMP cleaning apparatuses 1 and 1' of embodiments described above are used to clean both surfaces of the polished wafer W, the invention is not limited thereto. That is to say, the above design of providing at least one inner tank 17 (filled with a second cleaning solution CS2 that is used to clean the brush cleaner 10) into the chamber 12 for achieving a brush self-cleaning function may also be used in a post-CMP cleaning apparatus for cleaning only the polished wafer surface of the wafer W.

Figure 12:
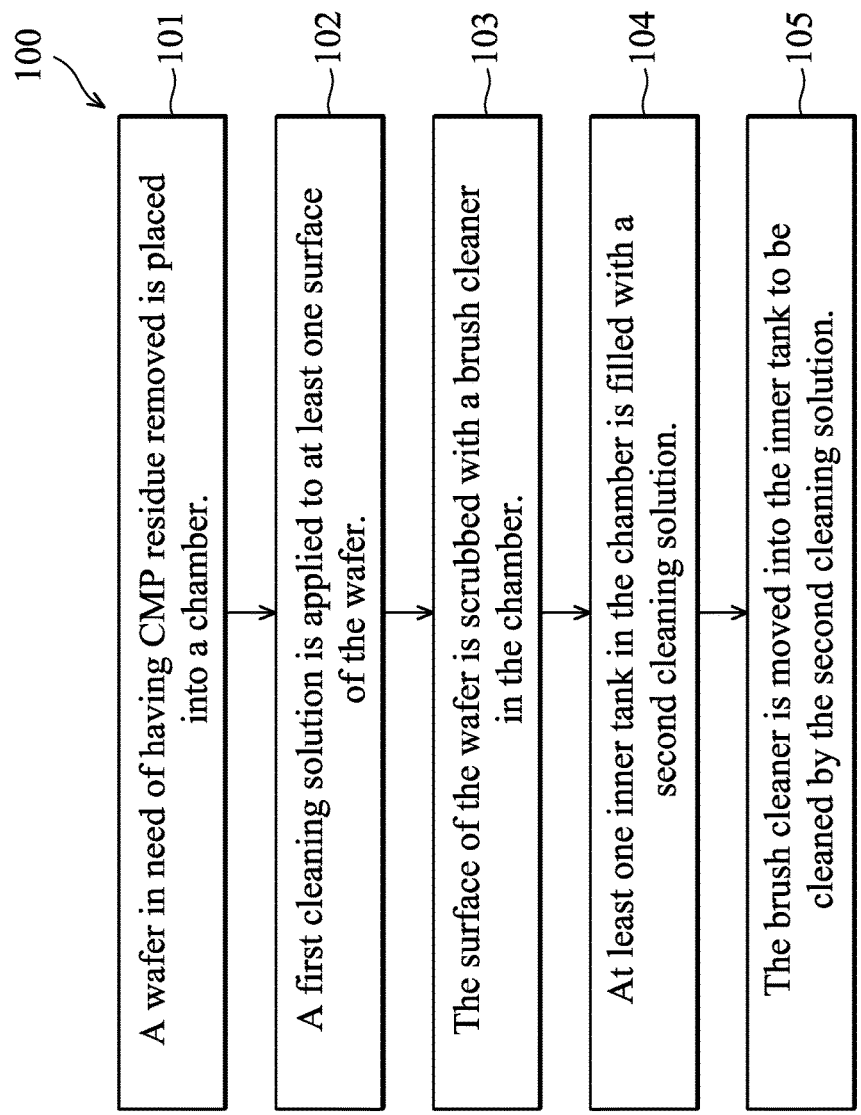
FIG. 12 is a flow chart of a post-CMP cleaning method in accordance with some embodiments.

FIG. 12 is a flow chart of a post-CMP cleaning method 100 in accordance with some embodiments. In operation 101, a wafer in need of having CMP residue removed is placed into a chamber. The chamber may be, for example, the cleaning chamber 12 of a post-CMP cleaning apparatus 1 or 1' described above.

In operation 102, a first cleaning solution is applied to at least one surface of the wafer. The first cleaning solution may be, for example, the cleaning solution CS1 which is applied by the spray unit 15 of the post-CMP cleaning apparatus 1 or 1' to the polished wafer surface or both surfaces of the wafer.

In operation 103, the surface of the wafer is scrubbed with a brush cleaner in the chamber. The brush cleaner may be, for example, the brush cleaner 10 of the post-CMP cleaning apparatus 1 or 1' including a pair of brushes 10A or only single brush 10B. In accordance with some embodiments, the brushes 10A and/or the brush 10B may be configured to have a cylindrical shape or a disk shape and include porous or sponge like resilient protrusions for scrubbing the surfaces of the wafer.

In operation 104, at least one inner tank in the chamber is filled with a second cleaning solution. Inner tanks may, for example, be inner tanks 17 of the post-CMP cleaning apparatus 1 or 1' for storing the (second) cleaning solution CS2. In accordance with some embodiments, the inner tanks 17 may be independently disposed in the chamber 12 or integrally formed with the chamber 12. In accordance with some embodiments, the second cleaning solution CS2 and the above first cleaning solution CS1 may be the same type or different types of cleaning solutions.

In operation 105, the brush cleaner is moved into the inner tank to be cleaned by the second cleaning solution. In accordance with some embodiments, when the brush cleaner 10 is submerged into and cleaned by the second cleaning solution CS2, the second cleaning solution CS2 is continuously supplied into the inner tank 17 so that the second cleaning solution CS2 in the inner tank 17 can be kept fresh and clean, thereby improving the efficiency of cleaning the brush cleaner 10. In accordance with some embodiments, the step of moving the brush cleaner 10 into the inner tank 17 to clean the brush cleaner 10 by the second cleaning solution CS2 may be performed either before or after the scrubbing process performed by the brush cleaner 10.

It should be understood that the above post-CMP cleaning method 100 is merely exemplary and may also have other steps and/or other sequences of steps.

Figure 13:
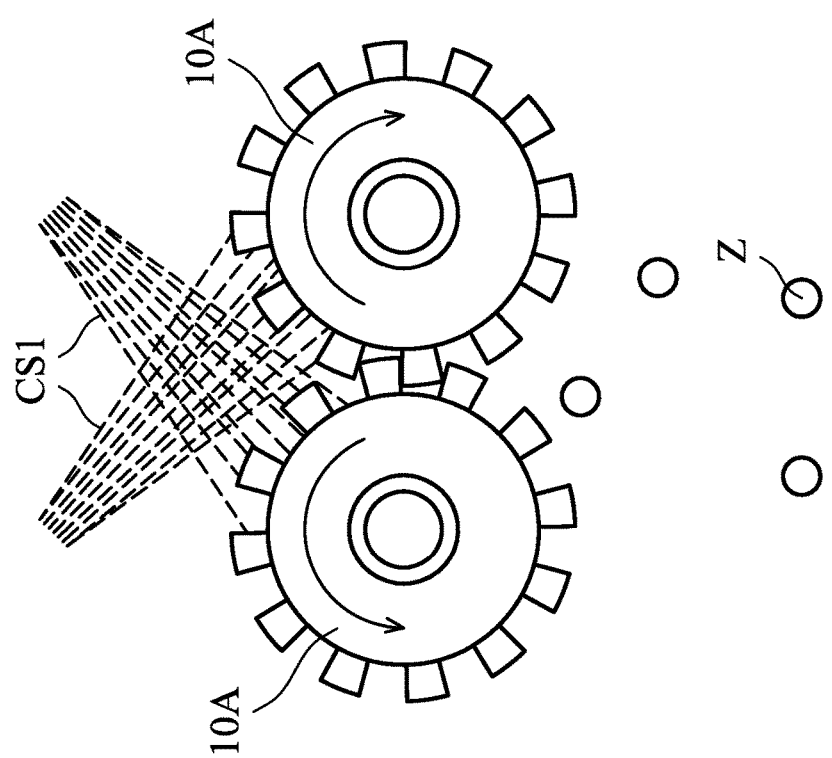
FIG. 13 is a schematic view illustrating that the brushes of the brush cleaner rub against each other to perform a self-cleaning in accordance with some embodiments.

FIG. 13 schematically illustrates that the brushes 10A of the brush cleaner 10 rub against each other to perform a self-cleaning in accordance with some embodiments. Specifically, after the brushes 10A remove the CMP residue on both surfaces of the polished wafer W, the brushes 10A may be moved to close to each other and rub against each other, in cooperation with the washing force of the cleaning solution CS1, to allow some of the CMP residue Z engaged on the porous surfaces of the brushes 10A to separate from the brushes 10A, thereby performing a brush self-cleaning. Afterwards, the brushes 10A may be moved into the inner tanks 17 to be cleaned by the second cleaning solution CS2 (FIG. 4B). Accordingly, the efficiency of cleaning the brush cleaner 10 may also be improved.

The embodiments of the present disclosure have some advantageous features: During the post-CMP cleaning process, a brush self-cleaning is performed by ex-situ cleaning the brush cleaner in the inner tank in the cleaning chamber of the post-CMP cleaning apparatus, either before or after the scrubbing process, so that the CMP residue may be removed from and not accumulate on the surface of the brush cleaner, leading to the extended lifespan of the brush cleaner and a reduction in fabrication cost. Furthermore, the cleaning quality of the post-CMP cleaning process may also be improved because the brush cleaner is maintained at consistent levels of cleanliness for the wafers from batch-to-batch and job-to-job. Experiment results indicated that the CMP residue having sizes between about 30 nm and about 50 nm have been successfully removed from surfaces of the polished wafer.

In some embodiments, an apparatus for performing a post-CMP cleaning is provided. The apparatus includes a chamber, a spray unit, a brush cleaner, and at least one inner tank. The chamber is configured to receive a wafer in need of having CMP residue removed. The spray unit is configured to apply a first cleaning solution to at least one surface of the wafer. The brush cleaner is configured to scrub the surface of the wafer. The inner tank is disposed in the chamber for storing a second cleaning solution that is used to clean the brush cleaner.

In some embodiments, an apparatus for performing a post-CMP cleaning is provided. The apparatus includes a chamber, a support mechanism, a spray unit, a brush cleaner, and at least one inner tank. The chamber is configured to receive a wafer in need of having CMP residue removed. The support mechanism is configured to support the wafer in the chamber. The spray unit is configured to apply a first cleaning solution to at least one surface of the wafer. The brush cleaner is configured to scrub the surface of the wafer.

The inner tank is disposed in the chamber for storing a second cleaning solution, wherein the brush cleaner is configured to be moved into the inner tank so that the brush cleaner is submerged into and cleaned by the second cleaning solution.

In some embodiments, a method for performing a post-CMP cleaning is provided. The method includes placing a wafer in need of having CMP residue removed into a chamber. The method also includes applying a first cleaning solution to at least one surface of the wafer. The method also includes scrubbing the surface of the wafer with a brush cleaner in the chamber. The method further includes providing at least one inner tank into the chamber, wherein the inner tank is filled with a second cleaning solution. In addition, the method includes moving the brush cleaner into the inner tank to clean the brush cleaner by the second cleaning solution.

Although embodiments of the present disclosure and their advantages have been described in detail, it should be understood that various changes, substitutions and alterations can be made herein without departing from the spirit and scope of the disclosure as defined by the appended claims. For example, it will be readily understood by those skilled in the art that many of the features, functions, processes, and materials described herein may be varied while remaining within the scope of the present disclosure. Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. An apparatus for performing a post Chemical Mechanical Polish (CMP) cleaning, the apparatus comprising:
a chamber configured to receive a wafer in need of having CMP residue removed;
a spray unit configured to apply a first cleaning solution to at least one surface of the wafer;
a brush cleaner configured to scrub the at least one surface of the wafer; and
at least one inner tank disposed in the chamber for storing a second cleaning solution that is used to clean the brush cleaner;
wherein the at least one inner tank comprises an inner compartment and an outer compartment, wherein the inner compartment is configured to store the second cleaning solution and receive the brush cleaner, and the outer compartment is configured to receive the second cleaning solution overflowing from the inner compartment.

2. The apparatus as claimed in claim 1, wherein the brush cleaner is configured to be moved between a first position and a second position, wherein the brush cleaner scrubs the at least one surface of the wafer at the first position, and the brush cleaner is submerged into the second cleaning solution in the at least one inner tank at the second position.

3. The apparatus as claimed in claim 1, wherein the at least one inner tank has a high-frequency or megasonic vibrator therein.

4. The apparatus as claimed in claim 1, further comprising a drain unit configured to drain the second cleaning solution from the outer compartment.

5. The apparatus as claimed in claim 1, further comprising a liquid delivery unit configured to supply the second cleaning solution into the at least one inner tank.

6. The apparatus as claimed in claim 5, wherein the liquid delivery unit comprises a heater that is used to heat the second cleaning solution.

7. The apparatus as claimed in claim 1, wherein the at least one inner tank has a plurality of protruding structures formed on a wall surface thereof and is configured to engage the brush cleaner.

8. The apparatus as claimed in claim 7, wherein the brush cleaner is configured to be pressed against and rotate over the plurality of protruding structures.

9. An apparatus for performing a post-CMP cleaning, the apparatus comprising:
a chamber;
a support mechanism comprising:
a first stage and a second stage positioned in the chamber, wherein the support mechanism is operable in a first mode, in which a top surface of the first stage faces upward and a top surface of the second stage face a sidewall of the chamber, and a second mode, in which the top surfaces of the first stage and the second stages face each other;
a spray unit configured to apply a first cleaning solution to at least one top surfaces of the first stage;
a brush cleaner configured to move along the top surface of the first stage in the first mode and move along the top surface of the second stage in the second mode; and
at least one inner tank disposed in the chamber for storing a second cleaning solution, wherein the brush cleaner is configured to be moved into the at least one inner tank so that the brush cleaner is cleaned by the second cleaning solution.

10. The apparatus as claimed in claim 9, further comprising a controller configured to control the brush cleaner to scrub over the at least one surface of a wafer in a specific sweeping profile.

11. The apparatus as claimed in claim 9, wherein each of the first stages and the second stages comprises an electrostatic chuck.

12. The apparatus as claimed in claim 9, wherein the first stage is configured to support a wafer in a horizontal orientation in the chamber so that a first surface of the wafer faces the brush cleaner, and the second stage is configured to support the wafer in a vertical orientation in the chamber so that a second surface of the wafer faces the brush cleaner, the second surface being opposite to the first surface.

13. The apparatus as claimed in claim 12, wherein one of the first stage and the second stage is configured to tilt during the transferring from the first mode to the second mode so as to transfer the wafer thereon to the other one of the first stage and the second stage.

14. The apparatus as claimed in claim 12, wherein at least one sensor is mounted on at least one of the brush cleaner, the first stage, and the second stage for detecting positions of the CMP residue on the wafer.

15. A method for performing a post-CMP cleaning, the method comprising:

placing a wafer in need of having CMP residue removed into a chamber;

applying a first cleaning solution to at least one surface of the wafer;

scrubbing the at least one surface of the wafer with a brush cleaner in the chamber;

filling an inner compartment of an inner tank in the chamber with a second cleaning solution;

moving the brush cleaner into the inner compartment of the inner tank to clean the brush cleaner by the second cleaning solution; and receiving the cleaning solution overflowing from the inner compartment with an outer compartment of the inner tank.

16. The method as claimed in claim 15, further comprising continuously supplying the second cleaning solution into the inner tank when the brush cleaner is cleaned by the second cleaning solution.

17. The method as claimed in claim 15, wherein the step of moving the brush cleaner into the inner tank to clean the brush cleaner by the second cleaning solution is performed either before or after the at least one surface of the wafer is scrubbed by the brush cleaner.

18. The method as claimed in claim 15, wherein the brush cleaner comprises a pair of brushes configured to scrub both surfaces of the wafer, and the brushes rub against each other after scrubbing the surfaces of the wafer to perform a self-cleaning.

19. The method as claimed in claim 15, wherein the first cleaning solution and the second cleaning solution are different types of cleaning solutions.

20. The method as claimed in claim 15, further comprising draining away the second cleaning solution from the outer compartment.

* * * * *